(12) United States Patent
Sakata et al.

(10) Patent No.: US 10,761,434 B2
(45) Date of Patent: Sep. 1, 2020

(54) SUBSTRATE HOLDING APPARATUS, EXPOSURE APPARATUS, AND ARTICLE MANUFACTURING METHOD

(71) Applicant: CANON KABUSHIKI KAISHA, Tokyo (JP)

(72) Inventors: Shunya Sakata, Utsunomiya (JP); Akihiro Takahashi, Saitama (JP); Noboru Osaka, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/422,760

(22) Filed: May 24, 2019

(65) Prior Publication Data

US 2019/0369506 A1  Dec. 5, 2019

(30) Foreign Application Priority Data

May 30, 2018 (JP) .................................. 2018-103896
Mar. 15, 2019 (JP) .................................. 2019-048237

(51) Int. Cl.
*G03F 7/20* (2006.01)
*H01L 21/687* (2006.01)
*H01L 21/027* (2006.01)

(52) U.S. Cl.
CPC ........ *G03F 7/70716* (2013.01); *G03F 7/7095* (2013.01); *G03F 7/70958* (2013.01); *H01L 21/68742* (2013.01); *H01L 21/68757* (2013.01); *H01L 21/0274* (2013.01)

(58) Field of Classification Search
CPC ............. G03F 7/70558; G03F 7/70608; G03F 7/70716; G03F 7/7095; G03F 7/70958; H01L 21/0274; H01L 21/68714; H01L 21/68742; H01L 21/68757
USPC .............................. 310/12.06; 355/53, 72, 75
See application file for complete search history.

(56) References Cited

U.S. PATENT DOCUMENTS

| 2008/0043210 | A1* | 2/2008 | Shibuta ............... G03F 7/70341 355/30 |
| 2011/0236162 | A1* | 9/2011 | Shikayama ....... H01L 21/68742 414/222.01 |
| 2018/0253019 | A1* | 9/2018 | Chen ...................... G03F 7/707 |

FOREIGN PATENT DOCUMENTS

CN        105045048 A      11/2015

\* cited by examiner

*Primary Examiner* — Colin W Kreutzer
(74) *Attorney, Agent, or Firm* — Canon U.S.A., Inc. IP Division

(57) ABSTRACT

There is provided a substrate holding apparatus including a base provided with a gap and a reflection member disposed in the gap and configured to reflect light that has transmitted the substrate to the substrate side, and an exposure apparatus including the substrate holding apparatus.

20 Claims, 16 Drawing Sheets

DIFFUSE REFLECTANCE
(SUBSTRATE HOLDING MECHANISM: BLACK CERAMIC)

REGULAR REFLECTANCE
(SUBSTRATE HOLDING MECHANISM: BLACK CERAMIC)

DIFFUSE REFLECTANCE
(SUBSTRATE LIFTING MECHANISM: BLACK RESIN)

REGULAR REFLECTANCE
(SUBSTRATE LIFTING MECHANISM: BLACK RESIN)

DIFFUSE REFLECTANCE
(CORRECTION MEMBER: TEFLON)

REGULAR REFLECTANCE
(CORRECTION MEMBER: TEFLON)

SUBSTRATE HOLDING APPARATUS, EXPOSURE APPARATUS, AND ARTICLE MANUFACTURING METHOD

BACKGROUND

Field of the Disclosure

The present disclosure relates to a substrate holding apparatus, an exposure apparatus, and an article manufacturing method.

Description of the Related Art

An exposure apparatus is used when manufacturing devices such as semiconductor devices and liquid crystal display elements by using photolithographic technology. An exposure apparatus projects a mask pattern on a substrate via a projection optical system to transfer the pattern.

A device manufacturing process includes a process of applying resist to a substrate, a process of transferring a pattern onto the substrate by exposing the resist to light, and a process of developing the substrate with the pattern transferred thereon. Generally, the process of applying resist to a substrate and the process of developing the substrate with a pattern transferred thereon are performed by a coater developer, which is different from an exposure apparatus for transferring a pattern onto a substrate by exposing the resist to light.

In the device manufacturing process, a device is manufactured while delivering a substrate between different apparatuses in this way. Each apparatus is provided with a substrate holding mechanism for holding a substrate by absorption to deliver the substrate. It is common for the substrate holding mechanism to include a base for holding a substrate and a substrate lifting mechanism such as a lift pin for elevating and lowering the substrate.

A gap is produced between the base and the substrate lifting mechanism which are disposed below the substrate. Accordingly, on the substrate, there arise regions where the base and the substrate lifting mechanism are disposed and regions where none of them are disposed.

Nowadays, it is common to manufacture devices by using a transparent substrate through which exposure light transmits. When exposing a transparent substrate to light, the exposure light transmitting the substrate is reflected by a base or a substrate lifting mechanism, and the resist applied to the substrate is exposed to the reflected light. When the gap provided on the base causes differences in the light quantity radiated onto the resist, exposure non-uniformity arises on the substrate.

As a technique for reducing the above-described exposure non-uniformity, Chinese Patent Application Publication No. 105045048 discusses a configuration for limiting the reflection of exposure light by providing an antireflection member in the gap below the substrate. Chinese Patent Application Publication No. 105045048 discusses a problem that the resist on the substrate is exposed to the exposure light entering the gap below the substrate as reflected light, and the exposure amount becomes excessive in the region on the substrate positioned above the gap. To reduce the exposure amount in the region on the substrate positioned above the gap, a substrate holding apparatus discussed in Chinese Patent Application Publication No. 105045048 includes an antireflection member in the gap.

Meanwhile, the inventors of the present application found that the exposure light entering the gap below the substrate advances to the lower portion of the substrate holding apparatus and is attenuated and that most part of the exposure light does not reach the resist on the substrate.

SUMMARY

According to an aspect of the present invention, a substrate holding apparatus includes a base provided with a gap and configured to hold a substrate, and a reflection member disposed in the gap and configured to reflect light transmitting through the substrate towards the substrate, wherein a reflectance of the reflection member to the light that has transmitted the substrate is higher than a reflectance of the base to the light that has transmitted the substrate.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. A substrate holding apparatus according to the present invention is suitable to hold a transparent substrate such as a sapphire substrate and a glass substrate. The sapphire substrate is used as a substrate, for example, for Light Emitting Diode (LED) elements. The glass substrate is used as a substrate, for example, for a liquid crystal panel.

Figure 1:
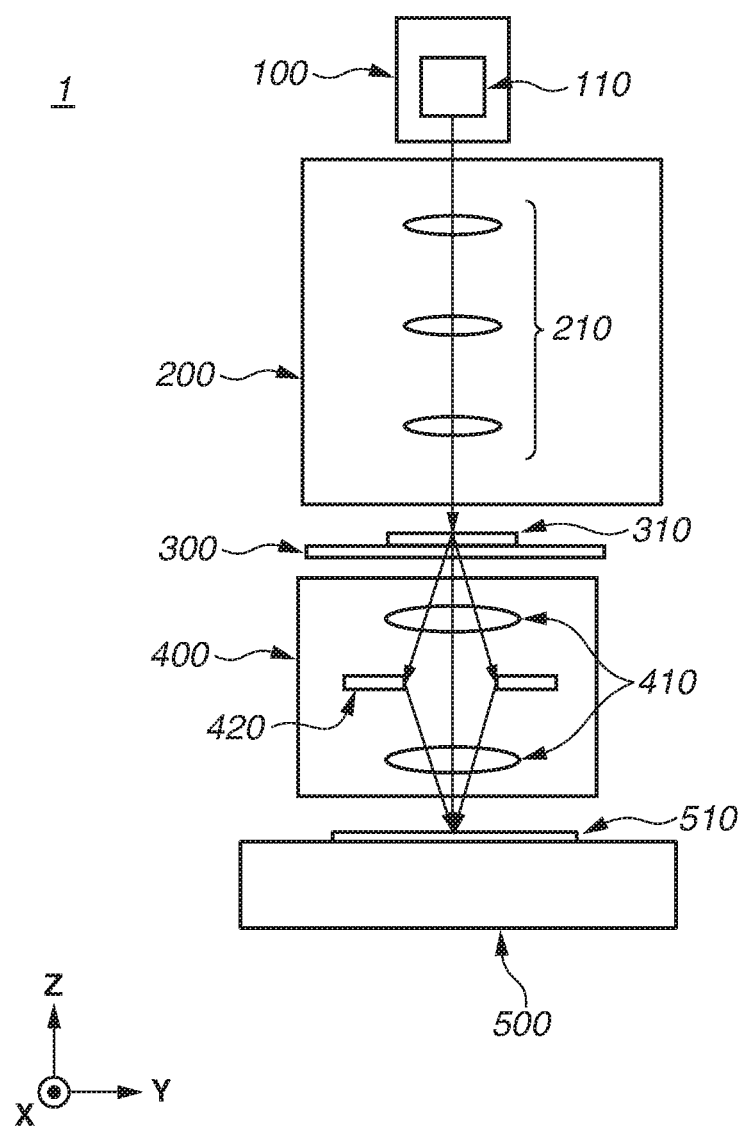
FIG. 1 is a schematic diagram illustrating an exposure apparatus.

FIG. 1 is a schematic view illustrating a configuration of an exposure apparatus 1 according to an aspect of an exemplary embodiment. The exposure apparatus 1 is used to form a pattern on a substrate. The exposure apparatus 1 includes a light source apparatus 100 including a light source 110, an illumination optical system 200 for illuminating an original plate 310, and an original plate stage 300 for holding the original plate 310. The exposure apparatus 1 further includes a projection optical system 400 for projecting an image of a pattern of the original plate 310 onto a substrate 510 held on a substrate holding mechanism 500 (substrate stage or substrate holding apparatus).

A high-pressure mercury lamp or excimer laser is used as the light source 110. As general exposure light, a g-line (with a wavelength of about 436 nm) and near-ultraviolet light with a wavelength region of 100 to 400 nm are used. For example, the g-line and an i-line (with a wavelength of about 365 nm) of an ultra-high-pressure mercury lamp, KrF excimer laser light (with a wavelength of about 248 nm), ArF excimer laser light (with a wavelength of about 193 nm), and F2 laser light (with a wavelength of about 157 nm) are used.

Light emitted from the light source 110 is guided to the original plate 310 via an optical system 210 included in the illumination optical system 200. The projection optical system 400 including an optical system 410 and an aperture diaphragm 420 projects the pattern of the original plate 310 onto the substrate 510 with a predetermined projection magnification. The substrate 510 is applied with a photosensitive material (resist) sensitive to light with a specific wavelength. When the image of the pattern of the original plate 310 is projected onto the resist, a latent image pattern is formed on the resist.

The substrate 510 is held by the substrate holding mechanism 500 as a substrate holding apparatus. The substrate holding mechanism 500 holds the substrate 510 through vacuum suction or electrostatic suction using a suction pad (not illustrated). A configuration of the substrate holding mechanism 500 will be described in detail below.

According to the present exemplary embodiment, the exposure apparatus 1 is a scanning exposure apparatus (scanner) for transferring the pattern of the original plate 310 onto the substrate 510 while synchronously scanning the original plate 310 and the substrate 510 in the scanning direction. In the following descriptions, the vertical direction is defined as the Z-axis direction, the scanning direction of the substrate 510 in a plane perpendicular to the Z-axis direction is defined as the Y-axis direction, and the non-scanning direction as the direction perpendicular to the Y-axis and the Z-axis directions is defined as the X-axis direction.

The light quantity (exposure amount) projected on the substrate 510 by the projection optical system 400 is an important factor for determining a line width of the pattern. Exposing the resist on the substrate 510 to light with a suitable exposure amount enables forming a high-accuracy pattern.

For example, when repetitively forming the same pattern in the pattern forming region on the substrate 510, it is desirable to expose the resist to light so that exposure non-uniformity does not occur in the entire region of the pattern forming region. Non-uniformity of the exposure amount projected on the substrate 510 can be reduced by devising the configurations of the illumination optical system 200 and the projection optical system 400. However, non-uniformity of the light quantity incident on the resist may occur if the resist on the substrate 510 is irradiated with what is called flare light.

Of the light transmitting the original plate 310, light that transmits the optical system 410 and the opening of the aperture diaphragm 420 included in the projection optical system 400 radiated onto the resist on the substrate 510 is referred to as regular light, and light other than the regular light is referred to as flare light.

<Occurrence of Exposure Non-Uniformity>

Figure 2A:
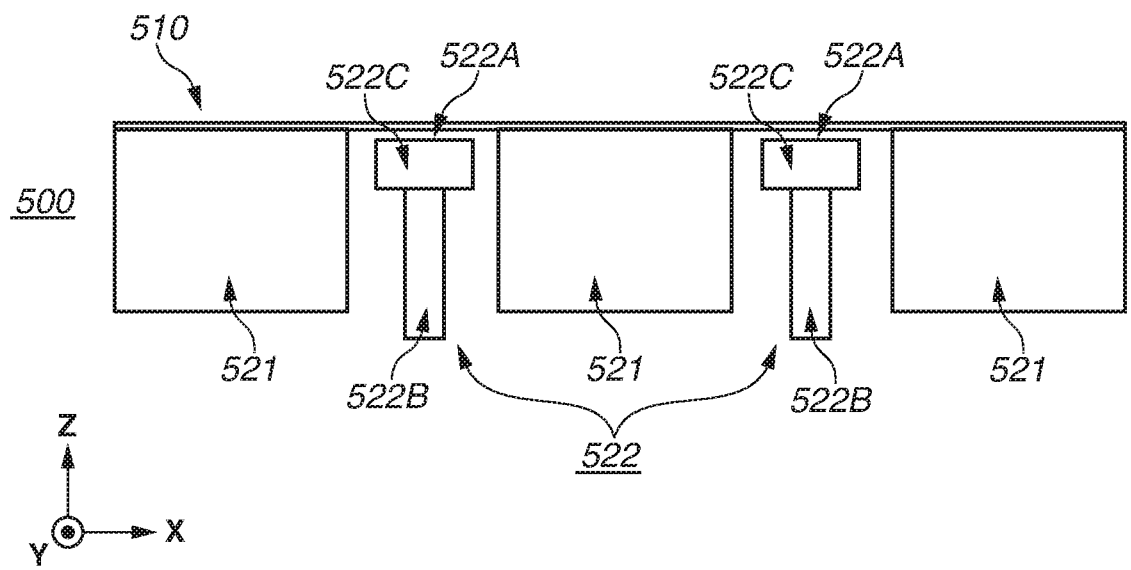
FIGS. 2A and 2B are schematic diagrams illustrating a substrate holding mechanism.
Figure 2B:
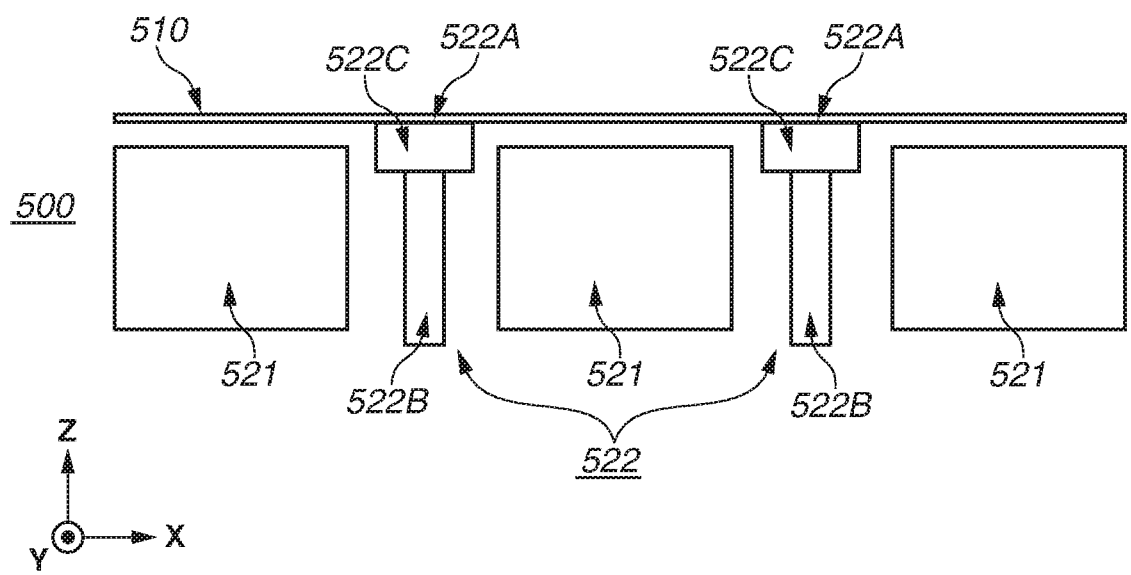

Causes of the occurrence of exposure non-uniformity in the exposure apparatus will be described below with reference to FIGS. 2A to 7. FIG. 2A illustrates a state where the substrate 510 is held by the substrate holding mechanism 500. FIG. 2B illustrates a state where the substrate 510 is elevated in the Z-axis direction by a substrate lifting mechanism 522. The substrate 510 is conveyed by a substrate conveyance apparatus such as a conveyance robot (not illustrated) in a state of being separated from the substrate holding mechanism 500 by the substrate lifting mechanism 522.

Referring to FIG. 2A, the substrate holding mechanism 500 vacuum suctions the substrate 510 by using a suction pad (not illustrated) positioned between a base 521 and the substrate 510. The suction pad is disposed on the base 521. The method for holding the substrate 510 is not limited to vacuum suction. For example, the substrate 510 may be held through electrostatic suction. When exposing the substrate 510 to light, the substrate 510 is held by the base 521, as illustrated in FIG. 2A.

The substrate lifting mechanism 522 is movable in the Z-axis direction. When the substrate 510 is separated from the base 521, as illustrated in FIG. 2B, the substrate lifting mechanism 522 moves in the Z-axis direction to upwardly elevate the substrate 510 in the Z-axis direction.

The substrate lifting mechanism 522 includes lifting portions 522B which vertically move in the Z-axis direction, and contact portions 522C which come in contact with the substrate 510. The contact portions 522C have upper surfaces 522A. Since the contact portions 522C contact the substrate 510, the material of the contact portions 522C is determined in consideration that the contact portions 522C hardly cause damage to the substrate 510 or wear out the substrate 510 by the contact. Generally, the contact portions 522C are made of a resin material.

As illustrated in FIG. 2A, in a state where the substrate 510 is held by the base 521, a small gap is provided between the substrate 510 and the substrate lifting mechanism 522. This gap prevents the substrate 510 from interfering with the substrate lifting mechanism 522, and reduces a risk that the position of the substrate 510 changes in the Z-axis direction.

Figure 3:
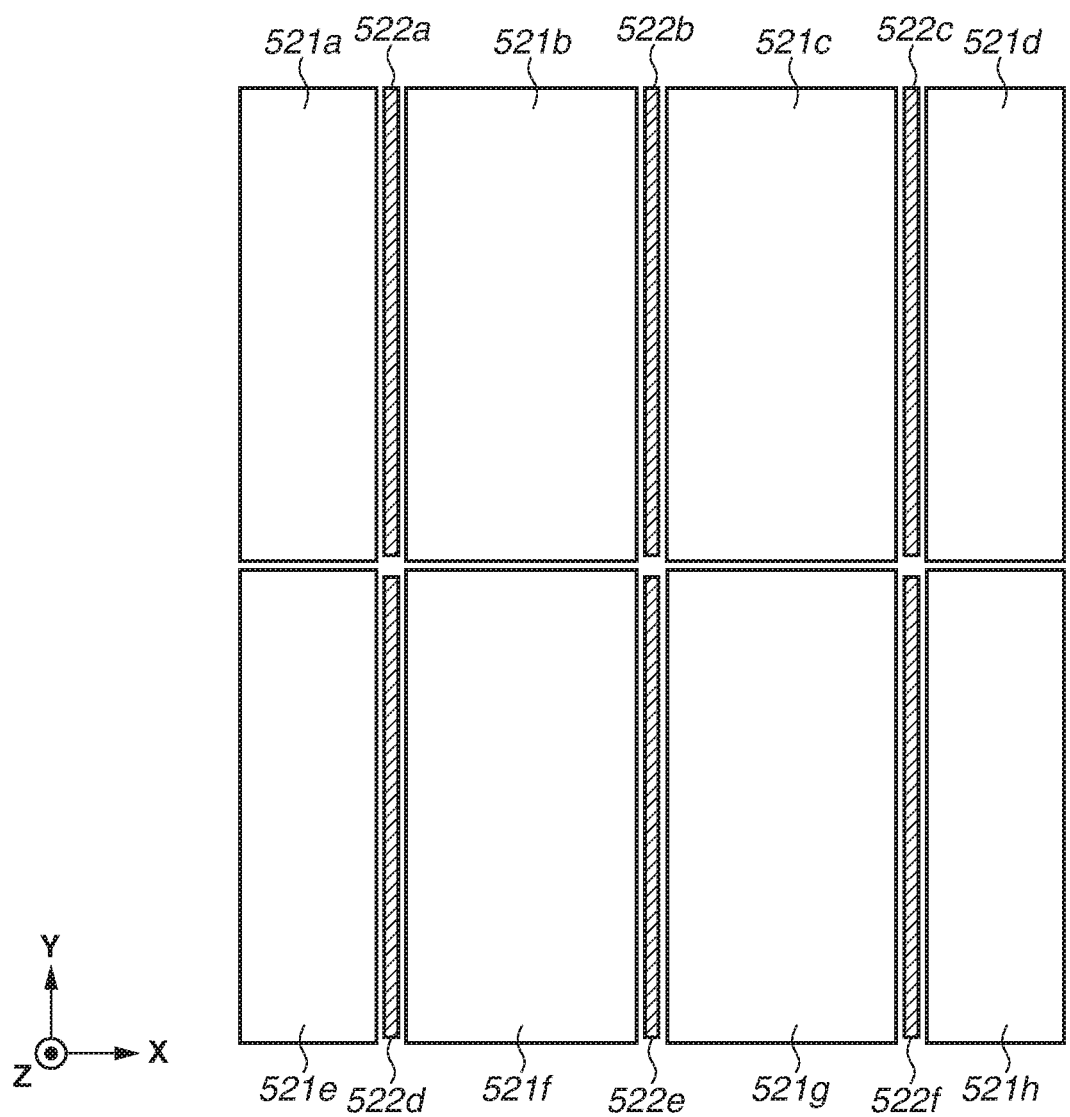
FIG. 3 is a diagram illustrating a base included in a substrate holding mechanism according to a first exemplary embodiment.

A positional relation between the base 521 and the substrate lifting mechanism 522 will be described below with reference to FIGS. 3 to 6C. FIG. 3 illustrates an example in which the base 521 configuring the substrate holding mechanism 500 is divided into eight substrate holding portions in the XY plane with gaps provided between the adjoining substrate holding portions. Substrate holding portions 521a, 521b, 521c, and 521d are disposed on the positive side in the Y-axis direction, and substrate lifting portions 522a, 522b, and 522c are disposed in the gaps between the substrate holding portions 521a and 521b, between the substrate holding portions 521b and 521c, and between the substrate holding portions 521c and 521d, respectively. Further, substrate holding portions 521e, 521f, 521g, and 521h are disposed on the negative side in the Y-axis direction, and substrate lifting portions 522d, 522e, and 522f are disposed in the gaps between the substrate holding portions 521e and 521f, between the substrate holding portions 521f and 521g, and between the substrate holding portions 521g and 521h, respectively. FIG. 3 illustrates an example in which lift bars are disposed as substrate lifting portions.

Figure 4:
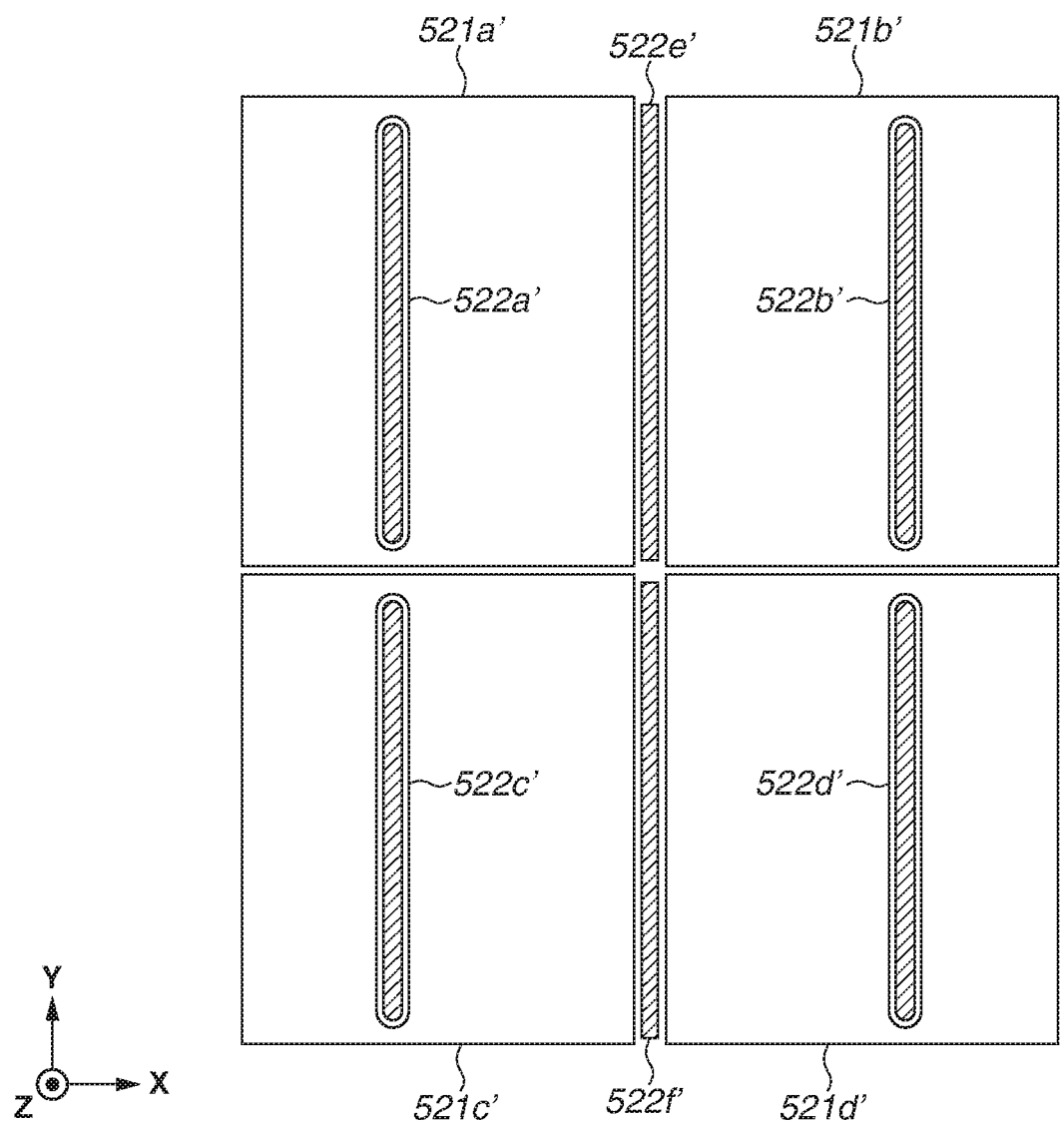
FIG. 4 is a diagram illustrating a base configuring a substrate holding mechanism according to a second exemplary embodiment.

FIG. 4 illustrates a state where the base 521 is divided into substrate holding portions 521a', 521b', 521c', and 521d'. The substrate holding portions 521a', 521b', 521c', and 521d' are provided with substrate lifting portions 522a', 522b', 522c', and 522d', respectively. A substrate lifting portion 522e' is disposed in the gap between the substrate holding portions 521a' and 521b'. A substrate lifting portion 522f is disposed in the gap between substrate holding portions 521c' and 521d'. Each of these substrate lifting portions illustrated in FIG. 4 is configured by a lift bar.

Figure 5:
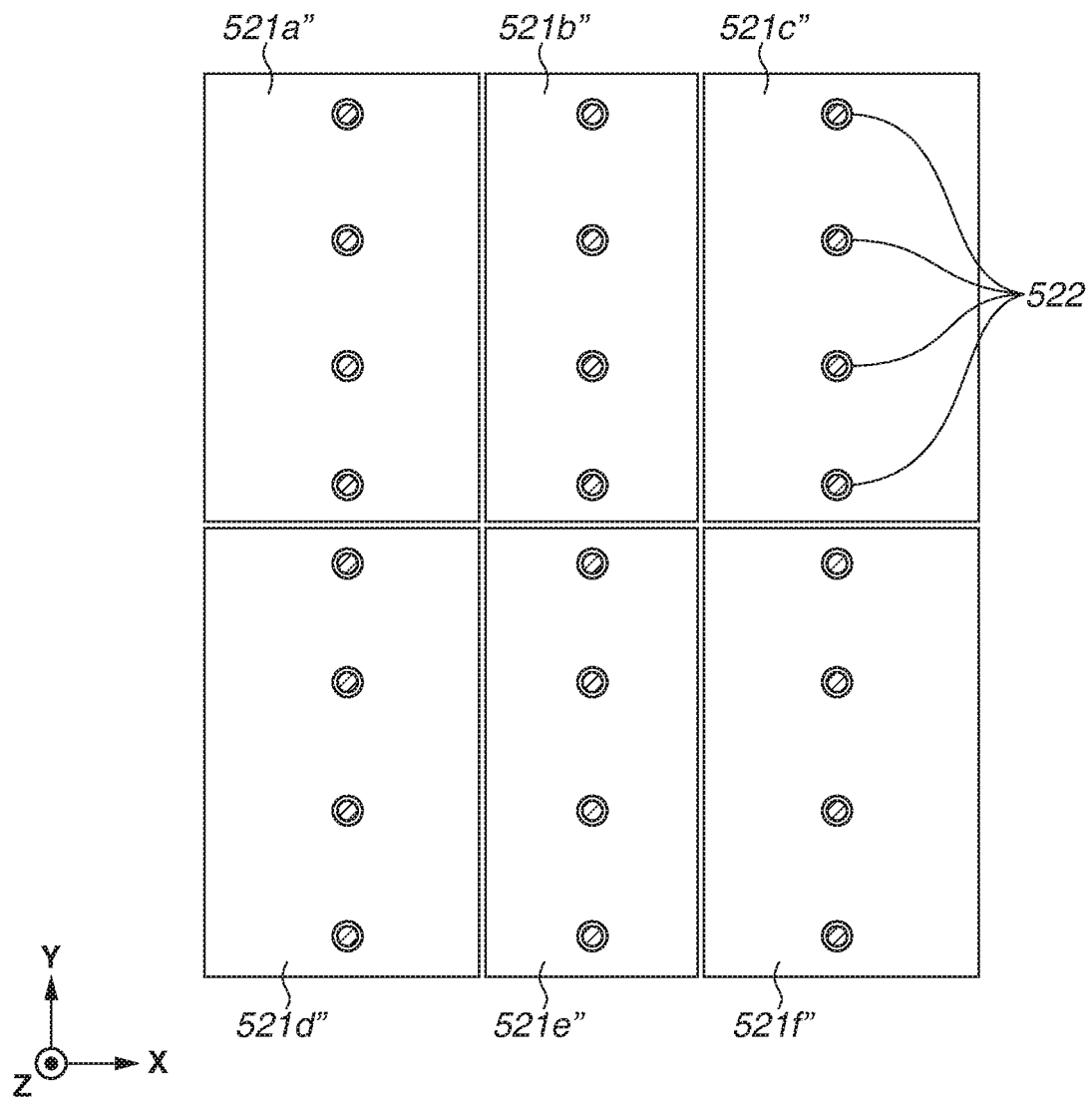
FIG. 5 is a diagram illustrating a base configuring a substrate holding mechanism according to a third exemplary embodiment.

Referring to FIG. 5, the base 521 is divided into substrate holding portions 521 a'', 521b'', 521c'', 521d'', 521e'', and 521f''. Each of these substrate holding portions is provided with through-holes. In each through-hole, a lift pin is provided as a substrate lifting mechanism 522 which moves in the Z-axis direction inside the through-hole.

Figure 6A:
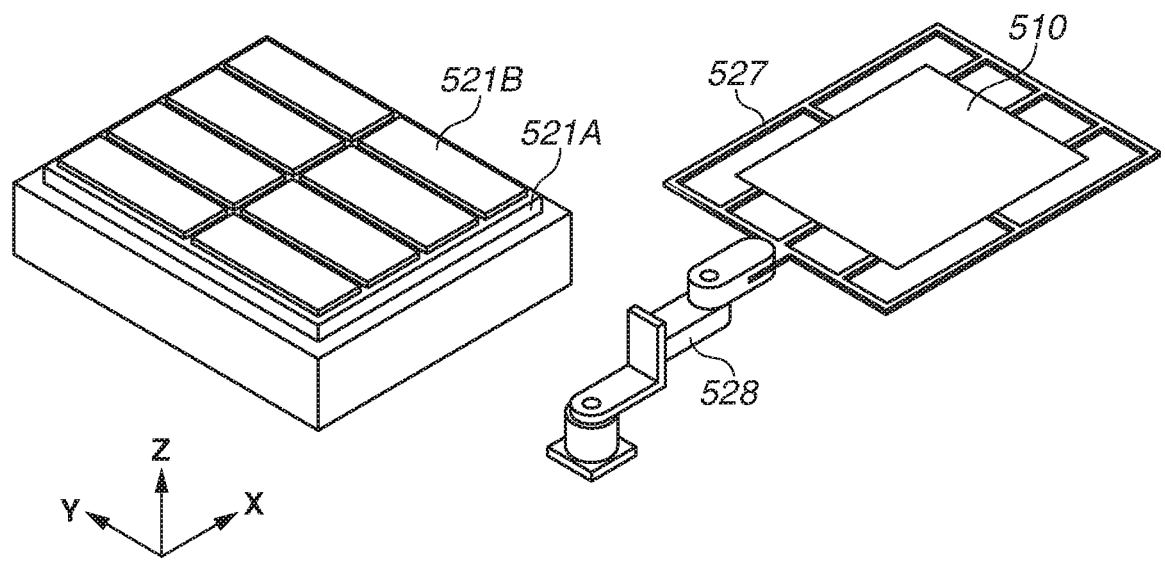
FIGS. 6A, 6B, and 6C are diagrams illustrating a base configuring a substrate holding mechanism according to a fourth exemplary embodiment.

Referring to FIG. 6A, the base 521 is composed of a base plate 521A and a plurality of substrate holding portions 521B disposed on the base plate 521A. Gaps are provided between the adjoining substrate holding portions 521B. By disposing substrate conveyance portions 527 with the substrate 510 mounted thereon in the gaps, the substrate conveyance portions 527 are overlaid on the base 521, and the substrate 510 is held by the base 521. The substrate conveyance portions 527 are driven when necessary in the X-axis, the Y-axis, and the Z-axis directions by a substrate conveyance apparatus 528. The substrate 510 can be elevated and lowered in the Z-axis direction by elevating and lowering the substrate conveyance portions 527 in the Z-axis direction in a state where the substrate 510 is held.

Figure 6B:
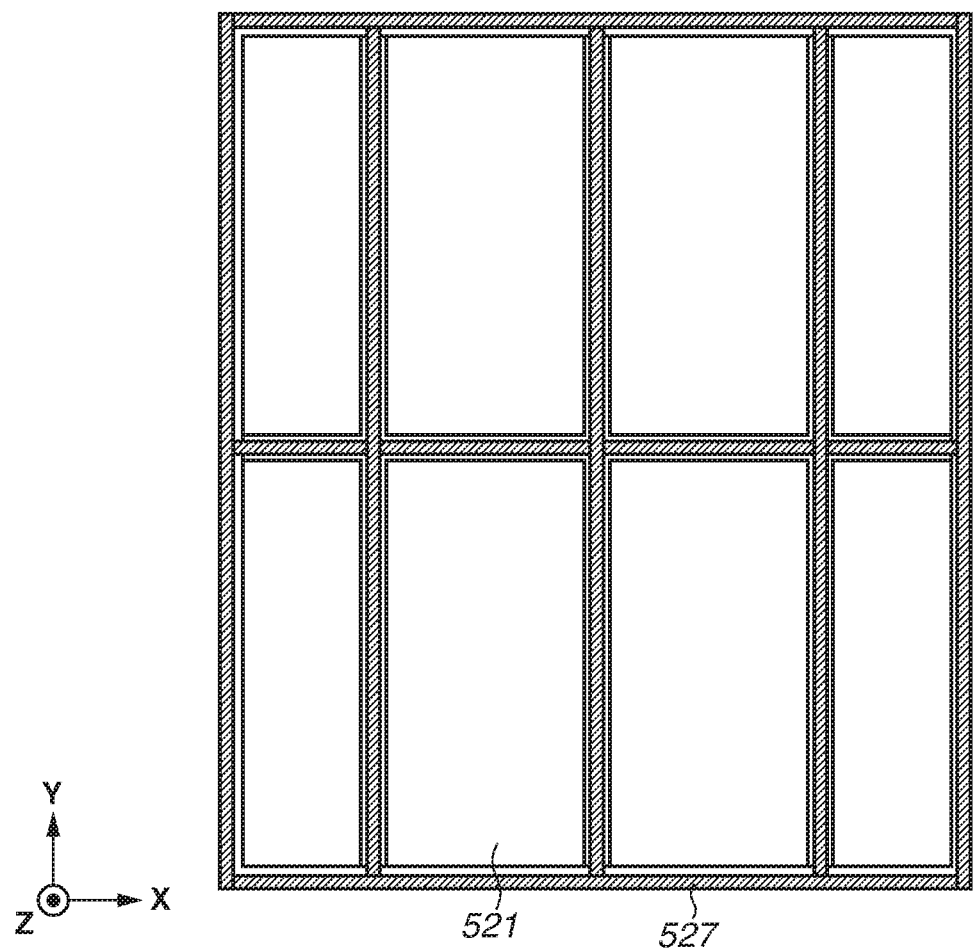
Figure 6C:
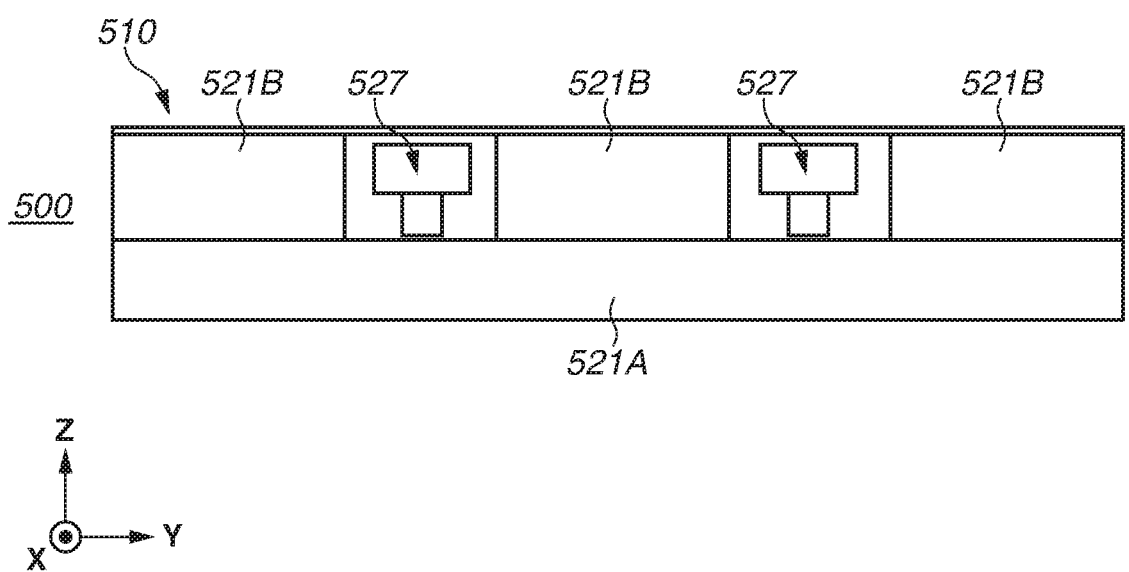

FIG. 6B illustrates a state where the substrate conveyance portions 527 are overlaid on the base 521. FIG. 6C illustrates a state where the substrate conveyance portions 527 are overlaid on the base 521 when viewed from the Y-axis direction. It can be seen that the substrate conveyance portions 527 are disposed in the gaps between the adjoining substrate holding portions 521B.

As described above, in the example illustrated in FIGS. 6A, 6B, and 6C, the substrate 510 is elevated and lowered by the substrate conveyance portions 527 instead of the substrate lifting mechanism 522. As described above, the substrate lifting mechanism 522 may be of the lift bar type illustrated in FIGS. 3 and 4 or of the lift pin type illustrated in FIG. 5. The substrate conveyance portions 527 may have a function of a substrate lifting mechanism, as illustrated in FIGS. 6A, 6B, and 6C. In any case, the substrate lifting portions configuring the substrate lifting mechanism 522 are disposed in the gaps provided in the base 521. As described above with reference to FIGS. 3 to 6C, gaps are provided between the adjoining substrate holding portions 521B and between a substrate holding portion 521B and a substrate lifting portion. Exposure light passing through these gaps causes exposure non-uniformity.

Figure 7:
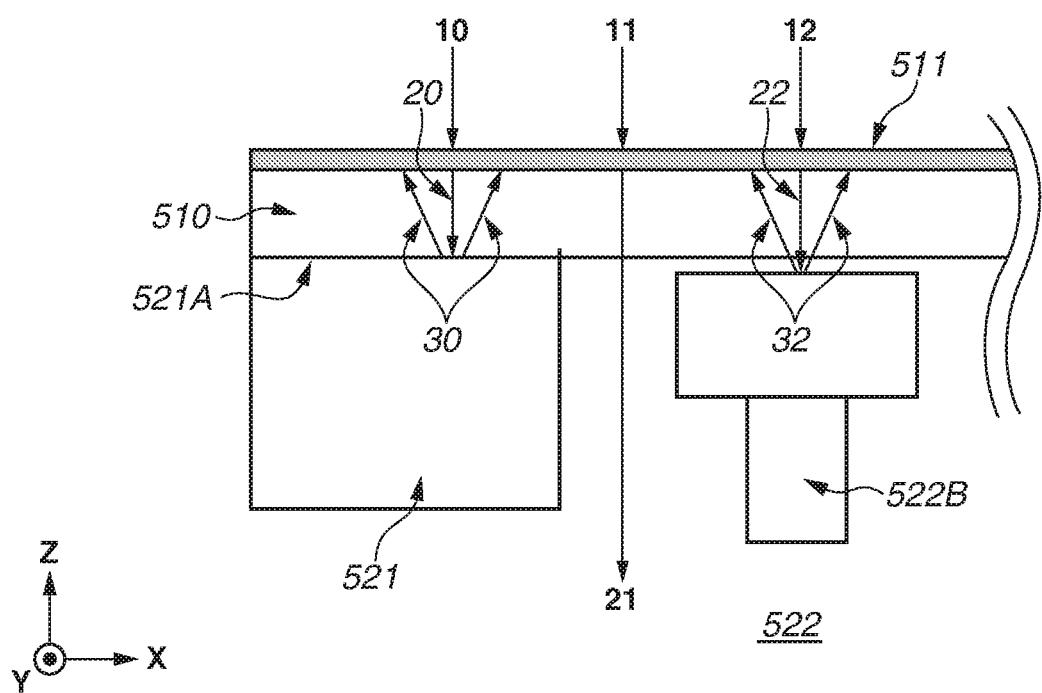
FIG. 7 is a schematic diagram illustrating an occurrence mechanism of exposure non-uniformity.

An occurrence mechanism of exposure non-uniformity will be described below with reference to FIG. 7. FIG. 7 illustrates a state where the resist 511 applied on the substrate 510 is irradiated with exposure light. A light ray 10 entering the resist 511 from the space above the base 521 transmits the resist 511 and the substrate 510 and is reflected by the upper surface 521A of the base 521. A light ray 12 entering the resist 511 from the space above the substrate lifting mechanism 522 transmits the resist 511 and the substrate 510 and is reflected by the upper portion of the substrate lifting mechanism 522. Meanwhile, a light ray 11 entering the resist 511 from above the gap between the base 521 and the substrate lifting mechanism 522 transmits the resist 511 and the substrate 510.

The exposure light entering the resist 511 is partly absorbed by the resist 511. The absorptance and transmittance of light differ depending on the wavelength of the exposure light and the optical characteristics of the resist 511. The transmittance of the exposure light to the resist 511 can be calculated as follows.

When light is assumed to be a one-dimensional plane wave which propagates in the Z direction, the amplitude E(Z, t) of the plane wave at time t is $$E(Z,t) = E_0 \exp[i(kZ - \omega t)] \tag{1}$$

where k denotes the wave number and w denotes the frequency. Using the complex index of refraction N, the frequency ω is represented as $$\omega = \frac{kc}{N} \tag{2}$$

Then, the amplitude E(Z, t) can be represented by:

$$\begin{aligned} E(Z, t) &= E_0 \exp\left[i\left(\frac{N\omega}{c}Z - \omega t\right)\right] \\ &= E_0 \exp\left[i\left\{(n + ki)\frac{\omega}{c}Z - \omega t\right\}\right] \\ &= E_0 \exp\left[-\frac{k\omega}{c}Z\right] \times \exp\left[i\omega\left(\frac{n}{c}Z - t\right)\right] \end{aligned} \tag{3}$$

Since ω=2πc/λ, $$E(Z, t) = E_0 \exp\left[-\frac{2\pi k}{c}Z\right] \times \exp\left[i\frac{2\pi}{\lambda}(nZ - tc)\right] \tag{4}$$

The light energy I(Z, t) can be obtained based on the norm of the square of the amplitude E(Z, t) or the square of the norm of the amplitude E(Z, t). Therefore, the light energy I(Z, t) is $$I(Z) = E_0^2 \exp\left[-\frac{4\pi k}{\lambda}Z\right] \tag{5}$$

Based on the formula 5, a transmittance T of light is calculated as follows:

$$T = \frac{I(d)}{I(0)} = \exp\left[-\frac{4\pi k}{\lambda}d\right] \tag{6}$$

Figure 8:
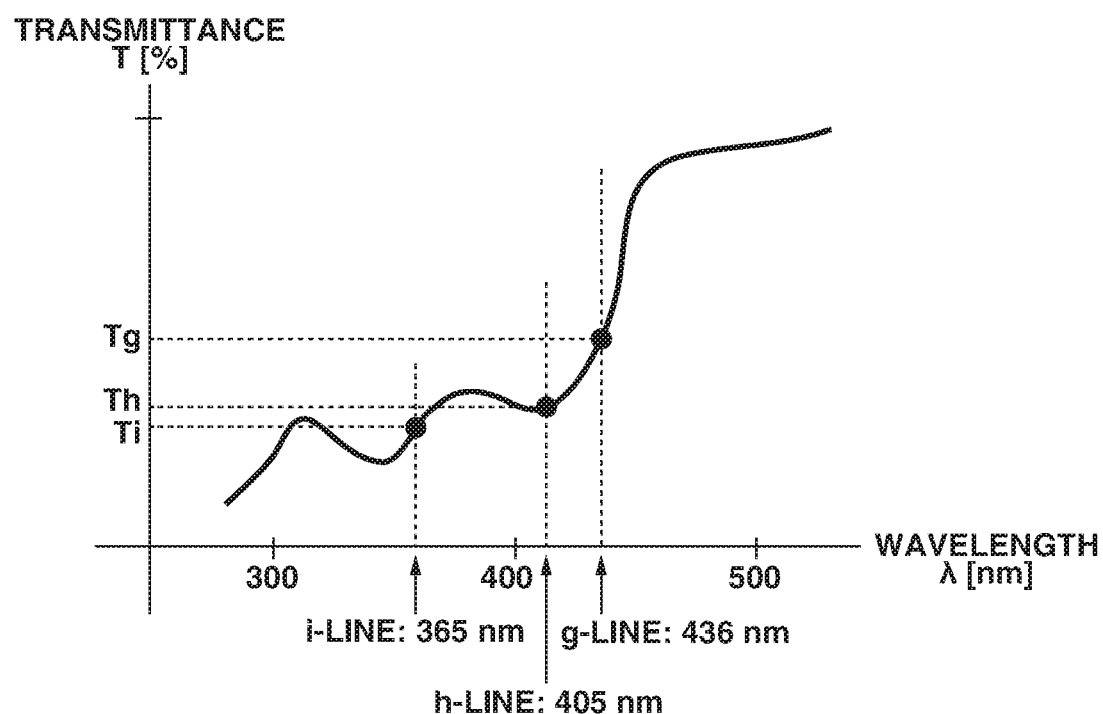
FIG. 8 is a diagram illustrating a relation between a wavelength of light and a transmittance of a photosensitive material.

The light transmitting the resist 511 with the transmittance T as calculated based on the formula (6) transmits the substrate 510 and reaches the upper portions of the base 521 and the substrate lifting mechanism 522. FIG. 8 illustrates a relation between the wavelength of light and the transmittance at a specific resist 511. In an exposure apparatus using a mercury lamp, the i-line (with a wavelength of about 365 nm), an K-line (with a wavelength of about 405 nm), the g-line (with a wavelength of about 436 nm), etc. are used as exposure light. FIG. 8 illustrates a transmittance Ti for the i-line, a transmittance Th for the h-line, and a transmittance Tg for the g-line. It can be seen that the value of the transmittance differs for each wavelength.

The light reaching the upper portions of the base 521 and the substrate lifting mechanism 522 is reflected by a reflection surface through regular reflection and diffuse reflection. Regular reflection refers to reflection with which the reflection angle is determined by the angle of the light incident on the reflection surface. In regular reflection, the incident angle and reflection angle are generally equal. Diffuse reflection refers to reflection not dependent on the incident angle of the light incident on the reflection surface. In diffuse reflection, the intensity of the light reflected at an angle θ with respect to the vertical line from the reflection surface depends on cos θ. Diffuse reflection is also referred to as Lambert reflection.

The light reflected by the upper surfaces of the base 521 and the substrate lifting mechanism 522 through regular reflection or diffuse reflection transmits the substrate 510 and then enters the resist 511 as flare light. Meanwhile, a light ray 11 illustrated in FIG. 7 enters the gap between the base 521 and the substrate lifting mechanism 522. Most of the light ray 11 is attenuated without entering the resist 511 again.

Accordingly, on the substrate 510, there arises a region where much flare light is generated and a region where flare light is hardly generated. As described above, flare light is generated depending on the reflection characteristics of the upper surfaces of the base 521 and the substrate lifting mechanism 522, and therefore is difficult to be sufficiently reduced. Since a different light quantity of flare light is incident on the resist 511 for each region on the substrate 510, exposure non-uniformity will accordingly occur.

<Method for Reducing Exposure Non-Uniformity>

Figure 9:
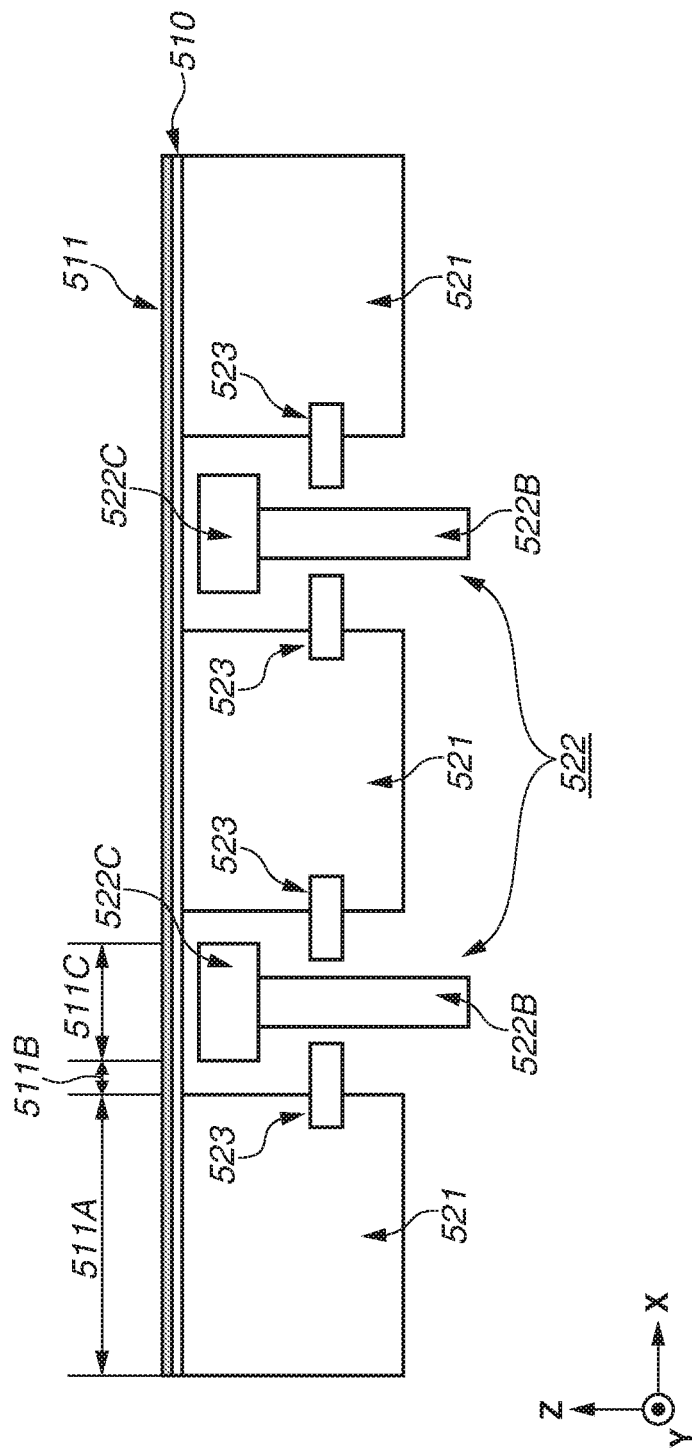
FIG. 9 is a diagram illustrating a configuration for reducing exposure non-uniformity.
Figure 10:
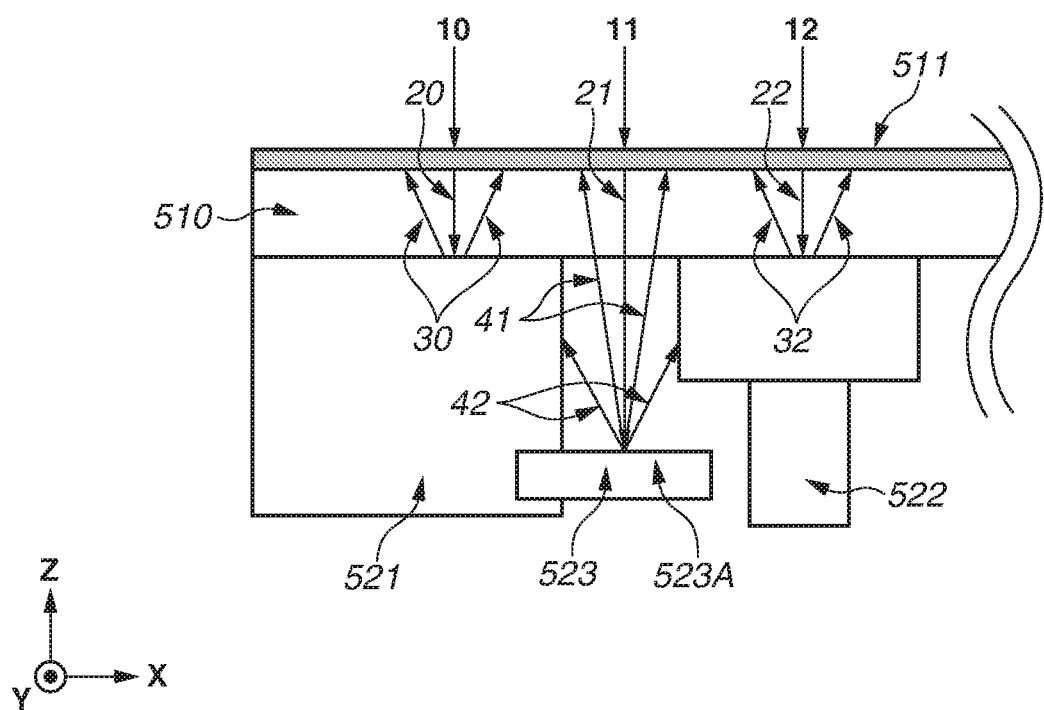
FIG. 10 is a schematic diagram illustrating a mechanism for reducing exposure non-uniformity.

A method for reducing exposure non-uniformity will be described below with reference to FIGS. 9 to 11. Referring to FIG. 9, the above-described exposure non-uniformity is reduced by disposing reflection members 523 in the gaps between the base 521 and the substrate lifting mechanism 522. Configurations other than the reflection members 523 illustrated in FIG. 9 are similar to the configurations illustrated in FIGS. 2A and 2B, and redundant descriptions thereof will be omitted. The reflection members 523 are made of a resin material such as acrylics and Teflon® or a metal material such as aluminum. A metal material having undergone surface processing such as plating can also be used.

It is desirable to dispose the reflection members 523 at the same height as the upper surface of the base 521 or the substrate lifting mechanism 522. However, since the gap between the upper surface of the base 521 and the upper surface of the substrate lifting mechanism 522 is generally very small, it is difficult to dispose the reflection members 523 in this gap. Therefore, the reflection members 523 are disposed in regions below contact portions 522C of the substrate lifting mechanism 522.

A mechanism in which exposure non-uniformity is reduced will be described below with reference to FIG. 10. Optical paths of the light rays 10 and 12 have been described above with reference to FIG. 7, and redundant descriptions thereof will be omitted. The light ray 11 transmits through the resist 511 and the substrate 510, reaches the upper surface 523A of the reflection member 523, and then is reflected toward the substrate by the upper surface 523A.

The upper surface 523A of the reflection member 523 is a diffuse reflection surface. Since light rays 41 out of reflected light have a small reflection angle, the light rays 41 pass through the gap between the base 521 and the substrate lifting mechanism 522, transmit the substrate 510, and then reach the resist 511. Meanwhile, light rays 42 out of reflected light have a large reflection angle with respect to the vertical line from the upper surface 523A. Therefore, the light rays 42 are radiated onto the side faces of the base 521 and the substrate lifting mechanism 522 and almost all the light rays 42 are absorbed. As a result, almost none of the light rays 42 reaches the resist 511.

Since the reflection member 523 is disposed in the gap between the base 521 and the substrate lifting mechanism 522, as described above, flare light will also enter the resist 511 positioned at the upper portion of the gap. This configuration reduces the difference between the light quantity which is reflected by the base 521 and reaches a first resist region above the base 521 and the light quantity which is reflected by the reflection member 523 and reaches a second resist region above the reflection member 523. This configuration also reduces the difference of the light quantity which is reflected by the substrate lifting mechanism 522 and reaches a third resist region above the substrate lifting mechanism 522 and the light quantity which is reflected by the reflection member 523 and reaches the second resist region above the reflection member 523.

As a result, the light quantity distribution of flare light radiated onto the resist 511 can be made uniform to a certain extent. Referring to FIG. 9, the first resist region is a region 511A, the second resist region is a region 511B, and the third resist region is a region 511C.

However, as described above, not all of the exposure light entering the reflection member 523 reaches the resist 511. Therefore, additional devisal is required to further reduce exposure non-uniformity.

The present exemplary embodiment achieves further reduction of exposure non-uniformity by suitably setting the reflection characteristics, such as reflectance, on each reflection surface of the base 521, the substrate lifting mechanism 522, and the reflection member 523. A method for determining the reflection characteristics will be described below.

As described above, the reflection characteristics of incidence light change with the shape of the reflection surface. If the reflection surface has a shape factor k (0<k<1) and the substance configuring the reflection surface has a reflectance R, the light quantity which reaches the resist 511 after being reflected by the reflection surface can be represented by a factor kR. The shape factor k has parameters such as the position of the reflection member 523 in the Z-axis direction and a width w of the gap between the base 521 and the substrate lifting mechanism 522, and is determined through light analysis and optical simulation.

Figure 11:
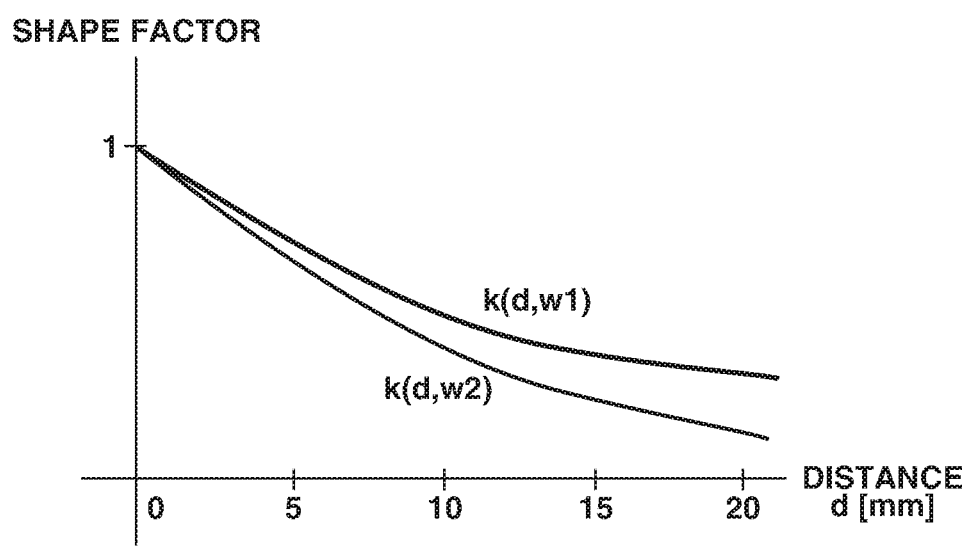
FIG. 11 is a diagram illustrating a relation between a position and a shape factor k of a reflection member.

FIG. 11 illustrates a relation between the position of the reflection member 523 in the Z-axis direction and the shape factor k. The horizontal axis illustrated in FIG. 11 indicates a distance d from the upper surface 521A of the base 521 to the upper surface 523A of the reflection member 523 in the Z-axis direction. When the distance d=0, the height of the upper surface 521A of the base 521 and the height of the upper surface 523A of the reflection member 523 are equal. FIG. 11 illustrates that the shape factor k changes with the width w of the gap between the base 521 and the substrate lifting mechanism 522. FIG. 11 also illustrates that the shape factor k increases with increasing width w (because w1>w2) and that the shape factor k decreases with increasing distance of the position of the reflection member 523 from the upper surface 521A of the base 521.

The regular reflectance is defined by the percentage of the ratio of the light quantity of the regular reflection light to the light quantity of the light entering the reflection surface. The diffuse reflectance is defined by the percentage of the ratio of the light quantity of the diffuse reflection light in all directions, excluding the regular reflection light, to the light quantity of the light entering the diffuse reflection surface. The shape factor k for the regular reflection light and the shape factor k for the diffuse reflection light can be respectively defined.

The light quantity of flare light depends on a coefficient TkR as a product of the above-described factor kR and the transmittance T of the resist 511. Ideally, equalizing the factor kR of each of the base 521, the substrate lifting mechanism 522, and the reflection member 523 enables equalizing the coefficient TkR for each region on the resist 511. This makes it possible to reduce non-uniformity of the exposure amount for each region on the resist 511 resulting in reduced exposure non-uniformity.

In terms of a regular reflectance R, a diffuse reflectance R', a shape factor k for the regular reflectance, and a shape factor for the diffuse reflectance, the shape factor k of the reflection member 523 is adjusted to satisfy at least either one of the following formulas (7-1) and (7-2).

$$\sum_\lambda T_\lambda(k'_S R'_{S,\lambda} + k_S R_{S,\lambda}) - \sum_\lambda T_\lambda(k'_C R'_{\lambda,C} + k_C R_{\lambda,C}) < |1\%| \quad (7\text{-}1)$$

$$\sum_\lambda T_\lambda(k'_S R'_{S,\lambda} + k_S R_{S,\lambda}) - \sum_\lambda T_\lambda(k'_l R'_{\lambda,l} + k_l R_{\lambda,l}) < |1\%| \quad (7\text{-}2)$$

Referring to the formulas (7-1) and (7-2), subscripts S, C, and l indicate parameters of the reflection member 523, the base 521, and the substrate lifting mechanism 522, respectively. A subscript λ indicates a parameter dependent on the wavelength. The formulas (7-1) and (7-2) indicate that, when the exposure light contains a plurality of wavelength components, the values relating to these parameters are summed up for each wavelength.

Exposure non-uniformity can be preferably reduced by adjusting the shape factor k and the reflectances R and R so that the formulas (inequalities) (7-1) and (7-2) are satisfied. According to the verification by the inventors of the present application, it has been found that, if the reflection member 523 according to the present invention is not used, the numerical values of the left-hand sides of the inequalities (7-1) and (7-2) become about 1.5 to 2.0%.

Although, in the present exemplary embodiment, the reflection member 523 is disposed in the gap between the base 521 and the substrate lifting mechanism 522, the reflection member 523 may be disposed in the gap between the adjoining substrate holding portions 521B, as illustrated in FIGS. 3 to 6C. It is because even if the substrate lifting mechanism 522 is not disposed between the adjoining substrate holding portions 521B, a problem similar to the above-described problem may occur if a gap is produced between the adjoining substrate holding portions 521B.

Subsequently, specific examples of materials configuring the base 521, the substrate lifting mechanism 522, and the reflection member 523 will be described. The base 521 is made of a black ceramic material. The substrate lifting mechanism 522 is made of a black resin material. The reflection member 523 is made of Teflon®.

Figure 12A:
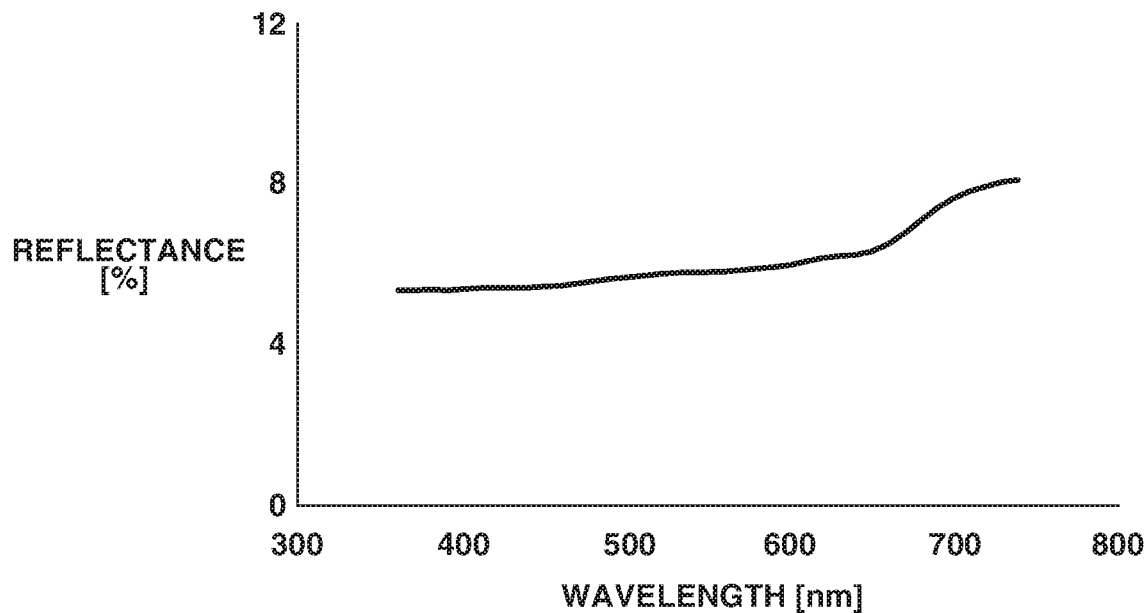
FIGS. 12A and 12B are diagrams illustrating a diffuse reflectance and a regular reflectance on the upper surface of the base, respectively.
Figure 12B:
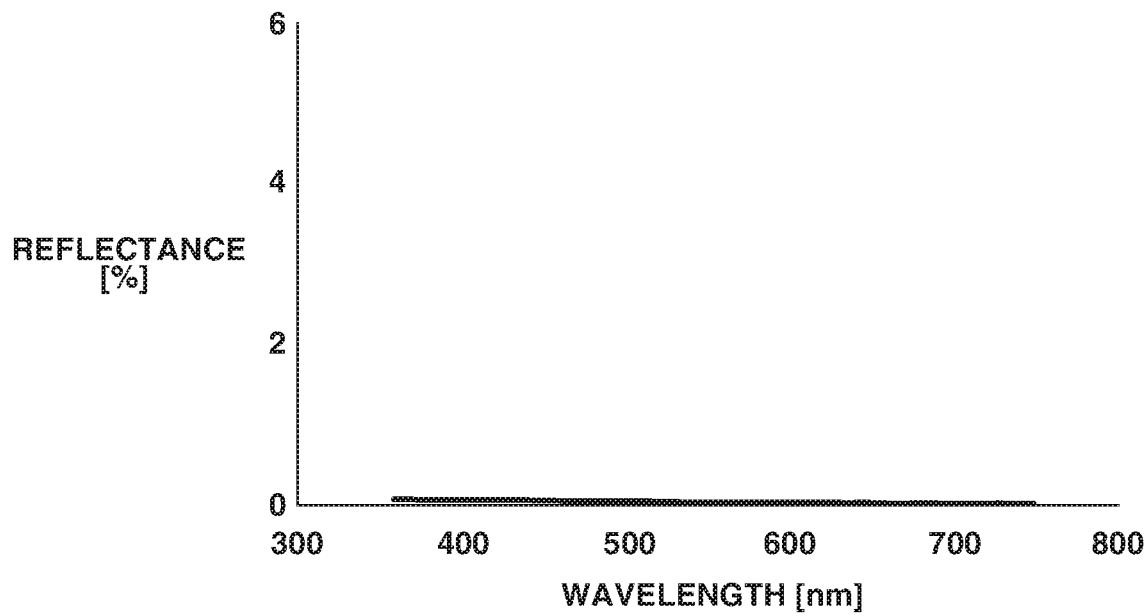
Figure 13A:
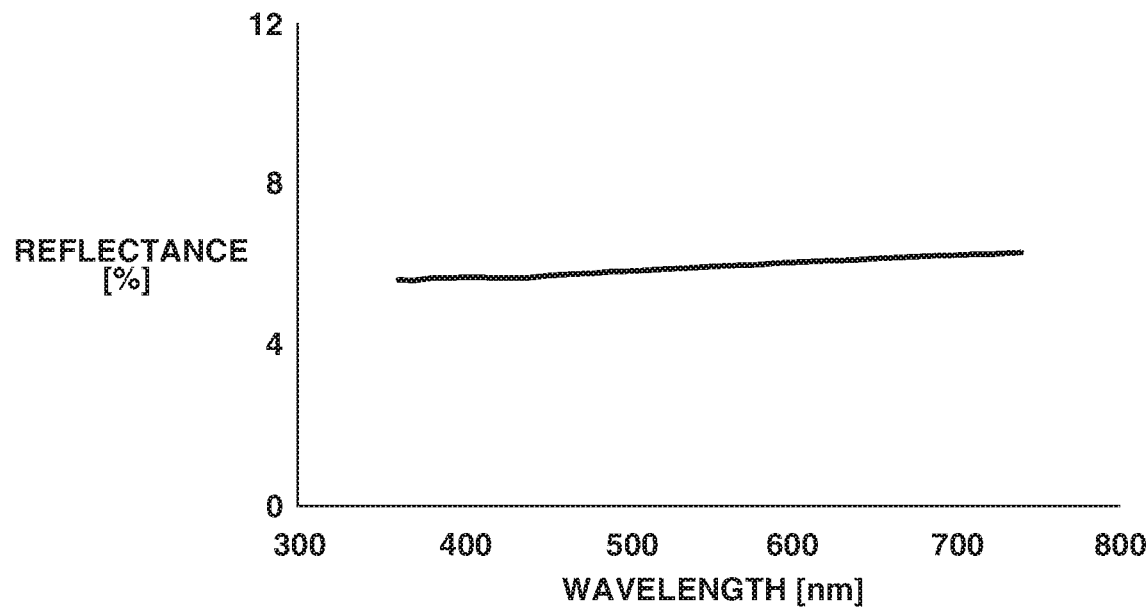
FIGS. 13A and 13B are diagrams illustrating a diffuse reflectance and a regular reflectance on the upper surface of a substrate lifting mechanism, respectively.
Figure 13B:
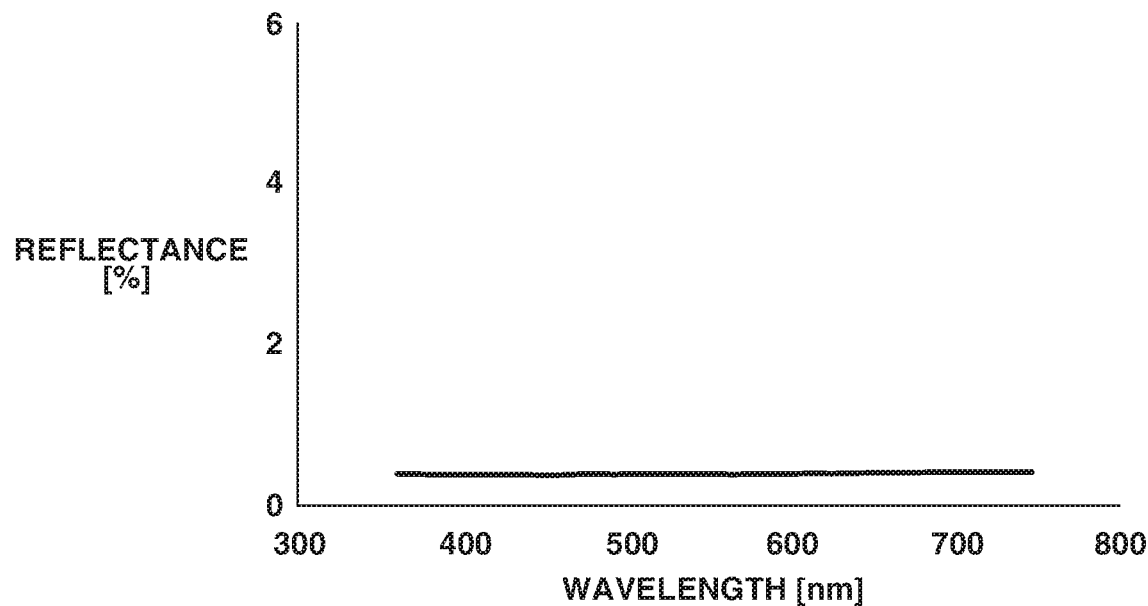
Figure 14A:
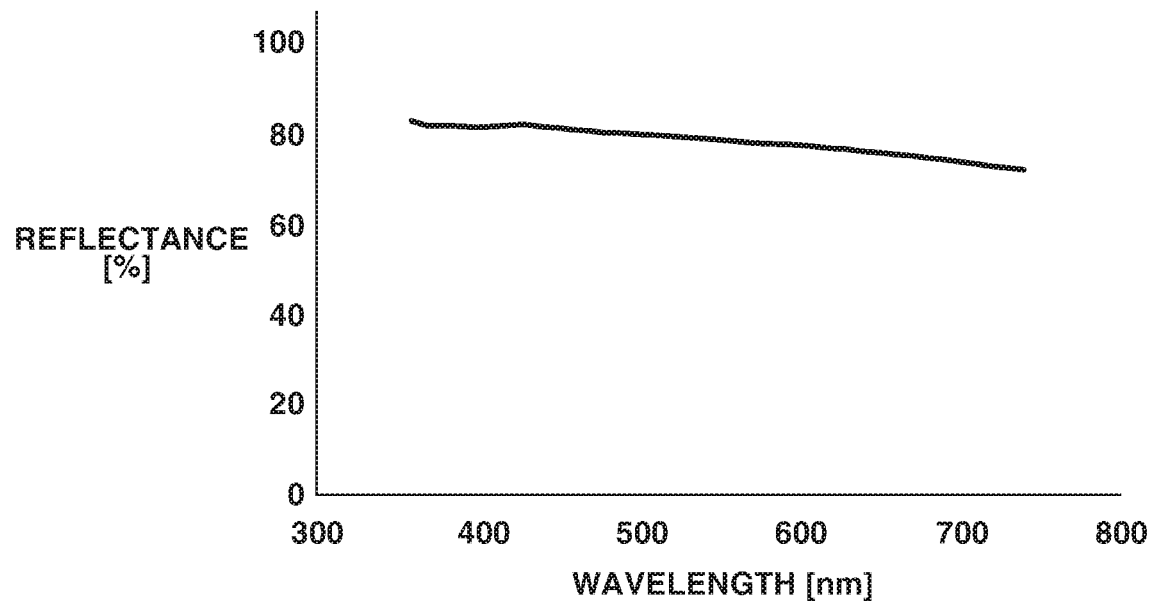
FIGS. 14A and 14B are diagrams illustrating a diffuse reflectance and a regular reflectance on the upper surface of a reflection member, respectively.
Figure 14B:
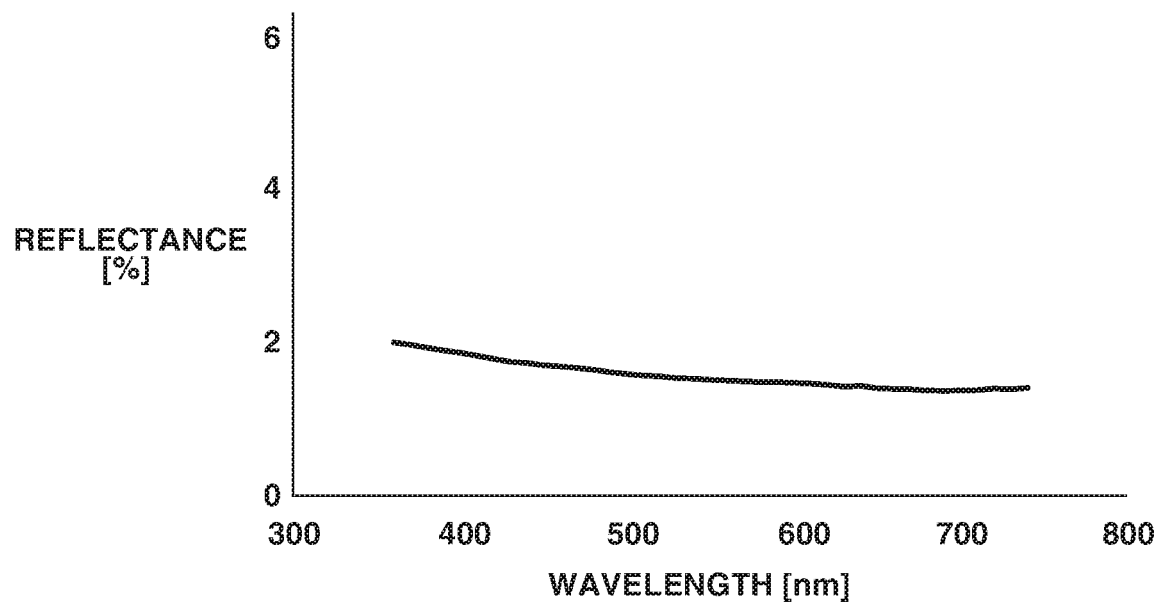

FIGS. 12A and 12B illustrate the diffuse reflectance and the regular reflectance on the upper surface 521A of the base 521 made of a black ceramic material, respectively. FIGS. 13A and 13B illustrate the diffuse reflectance and the regular reflectance on the upper surface 522A of the substrate lifting mechanism 522 made of a black resin material, respectively. FIGS. 14A and 14B illustrate the diffuse reflectance and the regular reflectance on the upper surface 523A of the reflection member 523 made of Teflon®, respectively.

As described above, the upper surface of the reflection member 523 is disposed below the upper surface of the base 521 and the upper surface of the substrate lifting mechanism 522. Thus, the shape factors ks and ks' of the reflection member 523 are smaller than the shape factors k of the base 521 and the substrate lifting mechanism 522. Accordingly, the difference between the factor kR of the reflection member 523 and the factor kR of the base 521 and the substrate lifting mechanism 522 is reduced by using a material having a comparatively high reflectance as the material of the reflection member 523. This enables reducing exposure non-uniformity.

For example, with a projection exposure apparatus in which the wavelength region of exposure light ranges from 350 to 450 nm, it is desirable that the reflectance changes by a small amount on the upper surfaces of the base 521, the substrate lifting mechanism 522, and the reflection member 523 in the wavelength region. If the reflectance largely changes, the exposure amount distribution may possibly largely change between when the i-line (with a wavelength of about 365 nm) is used as exposure light and when the g-line (with a wavelength of about 436 nm) is used as exposure light. This indicates that the magnitude of exposure non-uniformity changes with the wavelength of exposure light, which is not desirable from the viewpoint of reduction of exposure non-uniformity.

The change in reflectance on the upper surface of each member can be decreased by using materials having a small change in reflectance in the above-described wavelength region as the materials of the base 521, the substrate lifting mechanism 522, and the reflection member 523.

The materials configuring the base 521, the substrate lifting mechanism 522, and the reflection member 523 are not limited to the materials illustrated in FIGS. 12A to 14B. For example, the base 521 may be made of aluminum having undergone black alumite processing or a metal material having undergone Diamond-Like Carbon (DLC) coating. The substrate lifting mechanism 522 and the reflection member 523 may be made of a resin material such as acrylics or a metal material having undergone various types of coating.

<Position Adjustment for Reflection Member>

It is desirable to provide a position adjustment mechanism for adjusting the position of the reflection member 523 in the Z-axis direction. The reflectances of the base 521, the substrate lifting mechanism 522, and the reflection member 523 are mainly determined by the physical property value of materials. However, the reflectances may vary depending on manufacturing errors. The reflectances may also vary depending on the characteristics of the resist 511, the wavelength of exposure light, and exposure process.

The exposure non-uniformity which may be caused by the variation in these reflectances can be reduced by driving the reflection member 523 in the Z-axis direction. Since the shape factor k changes by driving the reflection member 523 in the Z-axis direction, exposure non-uniformity can be reduced by suitably varying the values of the left-hand sides of the above-described inequalities (7-1) and (7-2).

Figure 15:
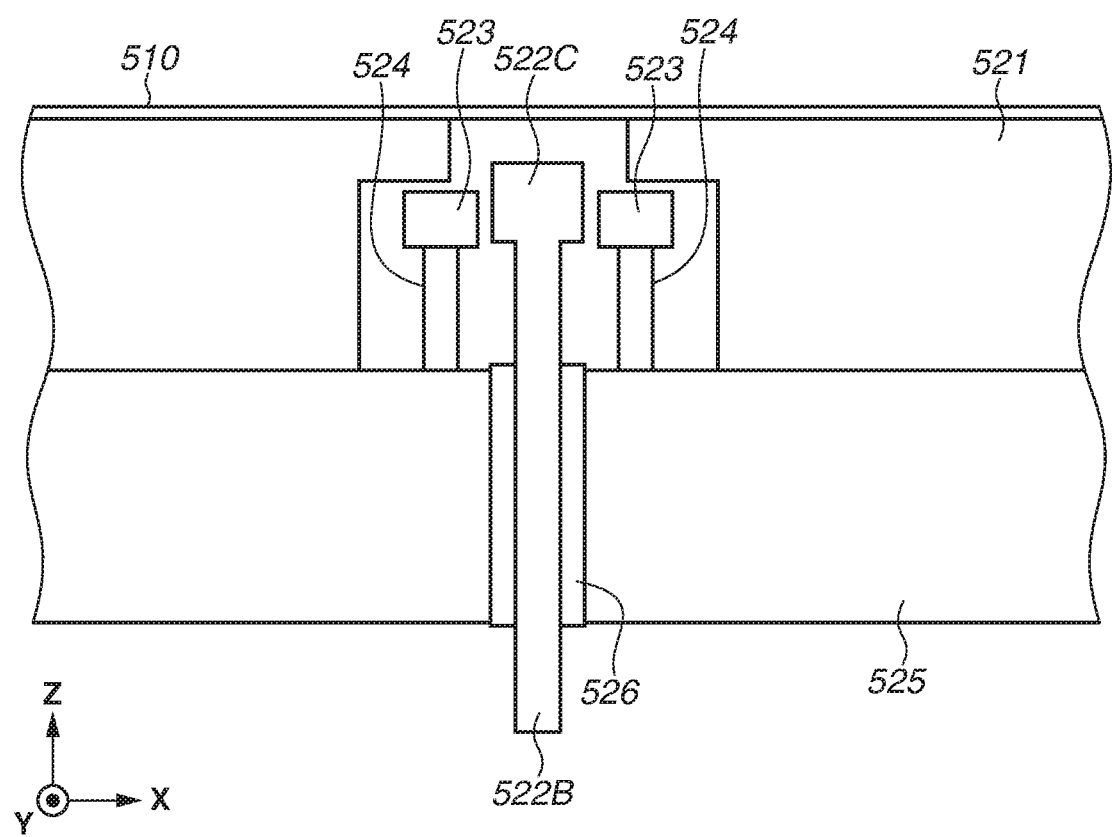
FIG. 15 is a diagram illustrating details of a substrate holding mechanism.

Next, the substrate holding apparatus including a position adjustment mechanism will be described with reference to FIG. 15. FIG. 15 illustrates a part of the configuration illustrated in FIG. 9, i.e., the configuration of a position adjustment mechanism 524 for the reflection members 523. As illustrated in FIG. 15, the reflection members 523 are disposed separately from the base 521 and the substrate lifting mechanism 522. The reflection members 523 are driven by the position adjustment mechanism 524 and are movable in the Z-axis direction.

The base 521 and the position adjustment mechanism 524 are attached to the upper portion of a top plate 525 on a movable stage (not illustrated), which is movable in the X-axis and the Y-axis directions. A lifting portion 522B configuring the substrate lifting mechanism 522 penetrates through the top plate 525, and is driven in the Z-axis direction along a guide 526 by an actuator (not illustrated). The position adjustment mechanism 524 is driven in the Z-axis direction by an actuator (not illustrated) provided on the top plate 525.

Other Modifications

The exemplary embodiments have been described above centering on the examples in which the substrate holding apparatus according to the present invention is applied to a scanner as the exposure apparatus 1. In addition, the substrate holding apparatus of the present invention is also applicable to a stepper for projecting the pattern of the fixed original plate 310 onto the substrate 510.

Articles Manufacturing Method

There is described a method for manufacturing an article (e.g., a semiconductor integrated circuit element and a liquid crystal display element) by using the above-described exposure apparatus. The article manufacturing method includes a process of forming a pattern by radiating exposure light onto a substrate held by using the substrate holding apparatus according to the exemplary embodiments, and a process of processing the substrate with the pattern formed thereon (development and etching). Exposure non-uniformity can be effectively reduced by using the substrate holding apparatus according to the present invention. As a result, the accuracy for forming a pattern on a substrate can be improved.

In comparison with conventional methods, the present article manufacturing method is advantageous in at least one of the performance, quality, productivity, and production cost of articles. The above-described exposure apparatus can offer such articles as high-definition devices (e.g., semiconductor integrated circuit elements and liquid crystal display elements).

While the present invention has specifically been described based on the above-described exemplary embodiments, the present invention is not limited thereto, and can be modified in diverse ways within the ambit of the appended claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-103896, filed May 30, 2018, and Japanese Patent Application No. 2019-048237, filed Mar. 15, 2019, which are hereby incorporated by reference herein in their entirety.

What is claimed is:

1. A substrate holding apparatus comprising:
   a base provided with a gap and configured to hold a substrate; and
   a reflection member disposed in the gap and configured to reflect light transmitting through the substrate towards the substrate,
   wherein a reflectance of the reflection member to the light that has transmitted the substrate is higher than a reflectance of the base to the light that has transmitted the substrate, and the reflectance of the reflection member is not less than 20%.

2. The substrate holding apparatus according to claim 1, wherein a diffuse reflectance of the reflection member to the light transmitting through the substrate is higher than a diffuse reflectance of the base to the light transmitting through the substrate.

3. The substrate holding apparatus according to claim 1, wherein a regular reflectance of the reflection member to the light that has transmitted the substrate is higher than the regular reflectance of the base to the light that has transmitted the substrate.

4. The substrate holding apparatus according to claim 1, wherein resist is applied on the substrate, and
   wherein the reflection member is disposed to reduce a difference between a quantity of the light reflected by the base and reaching a first resist region above the base and a quantity of the light reflected by the reflection member and reaching a second resist region above the reflection member.

5. The substrate holding apparatus according to claim 1, wherein the reflection member is disposed below an upper surface of the base.

6. The substrate holding apparatus according to claim 1, wherein the reflection member is movable in a vertical direction.

7. The substrate holding apparatus according to claim 6, further comprising an adjustment mechanism configured to move the reflection member in the vertical direction.

8. The substrate holding apparatus according to claim 1, wherein the base is provided with a through-hole, and the reflection member is disposed inside the through-hole.

9. The substrate holding apparatus according to claim 1, further comprising a lifting mechanism configured to elevate and lower the substrate in a vertical direction wherein the reflection member is disposed in a gap between the base and the lifting mechanism.

10. The substrate holding apparatus according to claim 9, wherein the reflectance of the reflection member to the light that has transmitted the substrate is higher than the reflectance of the lifting mechanism or a conveyance member that conveys the substrate.

11. The substrate holding apparatus according to claim 10, wherein resist material is applied on the substrate, and
    wherein the reflection member is disposed so as to reduce a difference between a quantity of the light reflected by the reflection member and reaching a second resist region above the reflection member and a quantity of the light reflected by the lifting mechanism or the conveyance member and reaching a third resist region above the lifting mechanism or the conveyance member.

12. The substrate holding apparatus according to claim 1, wherein the base includes a plurality of substrate holding portions for holding the substrate, and
    wherein the reflection member is disposed in a gap between the plurality of the substrate holding portions.

13. An exposure apparatus comprising:
    a substrate holding apparatus including a base provided with a gap and configured to hold a substrate and a reflection member disposed in the gap and configured to reflect light that transmitting through the substrate to the substrate side, wherein the exposure apparatus transfers, in a state where the substrate having characteristics for transmitting exposure light is held by the substrate holding apparatus, a pattern of an original plate onto the substrate by using exposure light, and wherein a reflectance of the reflection member to the light transmitting through the substrate is higher than a reflectance of the base to the light transmitting through the substrate, and the reflectance of the reflection member is not less than 20%.

14. An article manufacturing method comprising:

exposing a substrate to light by using an exposure apparatus for transferring a pattern of an original plate onto a substrate by using exposure light; and developing the exposed substrate, wherein the exposure apparatus comprises:

a substrate holding apparatus including a base provided with a gap and configured to hold a substrate and a reflection member disposed in the gap and configured to reflect light transmitting through the substrate to a side of the substrate, wherein the exposure apparatus transfers, in a state where the substrate having characteristics for transmitting exposure light is held by the substrate holding apparatus, the pattern of the original plate onto the substrate by using exposure light, and wherein a reflectance of the reflection member to the light transmitting through the substrate is higher than a reflectance of the base to the light transmitting through the substrate, and the reflectance of the reflection member is not less than 20%.

15. The substrate holding apparatus according to claim 1, wherein the reflection member is made of acrylic or Teflon®.

16. The exposure apparatus according to claim 13, wherein the reflection member is made of acrylic or Teflon®.

17. The article manufacturing method according to claim 14, wherein the reflection member is made of acrylic or Teflon®.

18. The substrate holding apparatus according to claim 1, wherein the reflectance of the base is 10% or less.

19. The exposure apparatus according to claim 13, wherein the reflectance of the base is 10% or less.

20. The article manufacturing method according to claim 14, wherein the reflectance of the base is 10% or less.

* * * * *